(12) United States Patent
Ohashi

(10) Patent No.: US 8,491,105 B2
(45) Date of Patent: Jul. 23, 2013

(54) PRODUCTION METHOD OF PIEZOELECTRIC ELEMENT, PIEZOELECTRIC ELEMENT, LIQUID EJECTING HEAD, AND LIQUID EJECTING APPARATUS

(75) Inventor: Koji Ohashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/426,412

(22) Filed: Mar. 21, 2012

(65) Prior Publication Data

US 2012/0242754 A1 Sep. 27, 2012

(30) Foreign Application Priority Data

Mar. 22, 2011 (JP) ................... 2011-063388

(51) Int. Cl.
*B41J 2/045* (2006.01)
(52) U.S. Cl.
USPC .................................. 347/72; 347/68; 347/71
(58) Field of Classification Search
USPC ....................... 347/68–72; 29/25.35
See application file for complete search history.

(56) References Cited

U.S. PATENT DOCUMENTS

| 6,705,708 B2 | 3/2004 | Murai |
| 7,065,847 B2 | 6/2006 | Murai |
| 7,254,877 B2 | 8/2007 | Murai |

FOREIGN PATENT DOCUMENTS

JP 2002-314163 10/2002

*Primary Examiner* — Matthew Luu
*Assistant Examiner* — Henok Legesse
(74) *Attorney, Agent, or Firm* — Workman Nydegger

(57) ABSTRACT

A production method of a piezoelectric element which includes an insulating film, a first electrode provided on the insulating film, a piezoelectric layer that is provided on the first electrode and is made of a composite oxide having a perovskite structure containing lead, zirconium, and titanium, and a second electrode provided on the piezoelectric layer on the opposite side to the first electrode, includes: forming and patterning the first electrode on the insulating film; forming island-shaped lanthanum nickel oxide portions over the insulating film and the first electrode; and forming a piezoelectric precursor film over the insulating film and the first electrode, and forming the piezoelectric layer having a piezoelectric film that is crystallized by baking the piezoelectric precursor film.

8 Claims, 9 Drawing Sheets

PRODUCTION METHOD OF PIEZOELECTRIC ELEMENT, PIEZOELECTRIC ELEMENT, LIQUID EJECTING HEAD, AND LIQUID EJECTING APPARATUS

This application claims a priority to Japanese Patent Application No. 2011-063388 filed on Mar. 22, 2011 which is hereby expressly incorporated by reference herein in its entirety.

BACKGROUND

1. Technical Field

The present invention relates to a production method of a piezoelectric element having a first electrode, a piezoelectric layer, and a second electrode, a piezoelectric element, a liquid ejecting head, and a liquid ejecting apparatus.

2. Related Art

As a piezoelectric element used in a liquid ejecting head, for example, there is a piezoelectric element configured by interposing a piezoelectric material that presents an electromechanical conversion function between two electrodes. Such a piezoelectric element is mounted in the liquid ejecting head as, for example, an actuator device in a flexural vibration mode. As a representative example of the liquid ejecting head, for example, there is an ink jet type recording head in which a part of a pressure generation chamber communicating with a nozzle opening that discharges ink droplets is configured as a vibration plate, and the vibration plate is deformed by the piezoelectric element to pressurize ink in the pressure generation chamber, thereby discharging the ink as ink droplets from the nozzle opening.

As one of such kinds of ink jet type recording head, there is an ink jet type recording head in which piezoelectric elements having insulating films made of zirconium oxide, first electrodes, piezoelectric layers, and second electrodes are arranged on one surface side of a flow path formation substrate having pressure generation chambers formed therein. Here, as the piezoelectric layer, a layer using a material containing lead, zirconium, and titanium, such as, lead zirconate titanate (PZT) is widely used.

However, when the piezoelectric layer (PZT) is formed as a film on the insulating film made of zirconium oxide, the piezoelectric layer is formed into a crystal having a grain size of greater than 1 μm, so that there is a problem in that the piezoelectric layer is more likely to become a starting point of breakage when a voltage is applied to the piezoelectric element.

Therefore, a method of suppressing an increase in grain size of a piezoelectric layer by providing titanium on an insulating film is suggested (for example, refer to JP-A-2002-314163).

In JP-A-2002-314163, after a first electrode is formed on the entire surface of an insulating film, titanium that becomes a nucleus is formed on the first electrode, a first piezoelectric film is then formed, and thereafter the first electrode and the first piezoelectric film are patterned. In addition, titanium that becomes a nucleus is further provided over the insulating film and the first piezoelectric film, and a second or further piezoelectric films are formed on the titanium.

However, even in a case where titanium is provided as in JP-A-2002-314163, there are problems in that small holes occur in a boundary part between the first electrode and the insulating film, and when a voltage is applied to a piezoelectric element, cracks occur in the piezoelectric layer from the small holes as the starting points.

This problem occurs not only in the ink jet type recording head but also in heads that eject liquids other than ink. This problem is not limited to piezoelectric elements mounted in the liquid ejecting heads and is also present in piezoelectric elements mounted in other devices.

SUMMARY

An advantage of some aspects of the invention is that it provides a production method of a piezoelectric element capable of suppressing cracks in a piezoelectric layer, a piezoelectric element, a liquid ejecting head, and a liquid ejecting apparatus.

According to an aspect of the invention, there is provided a production method of a piezoelectric element which includes an insulating film, a first electrode provided on the insulating film, a piezoelectric layer that is provided on the first electrode and is made of a composite oxide having a perovskite structure containing lead, zirconium, and titanium, and a second electrode provided on the piezoelectric layer on the opposite side to the first electrode, including: forming and patterning the first electrode on the insulating film; forming island-shaped lanthanum nickel oxide portions over the insulating film and the first electrode; and forming a piezoelectric precursor film over the insulating film and the first electrode, and forming the piezoelectric layer having a piezoelectric film that is crystallized by baking the piezoelectric precursor film.

In this aspect, by providing the lanthanum nickel oxide portions on the insulating film, the piezoelectric layer in which crystals have minute grain sizes can be formed on the insulating film, and formation of small holes in the boundary of the piezoelectric layer between the insulating film and the first electrode can be suppressed, thereby suppressing an occurrence of cracks from the small holes as the starting points. In addition, the crystal orientation of the piezoelectric layer can be controlled by the lanthanum nickel oxide portions, so that a piezoelectric element having the piezoelectric layer with excellent piezoelectric characteristics can be produced. Moreover, by forming the lanthanum nickel oxide portions into island shapes, the lanthanum nickel oxide portions are suppressed from functioning as an electrode, so that a piezoelectric active portion which becomes an actual driving portion of the piezoelectric element can be specified by the first electrode.

Here, it is preferable that in the forming of the lanthanum nickel oxide portions, the lanthanum nickel oxide portions be formed to have a thickness of equal to or greater than 4 nm and equal to or smaller than 20 nm. Accordingly, an occurrence of small holes in the piezoelectric layer can be reliably suppressed, and the lanthanum nickel oxide portions are suppressed from functioning as an electrode, so that the piezoelectric active portion which becomes an actual driving portion of the piezoelectric element can be specified by the first electrode.

In addition, it is preferable that a plurality of the first electrodes be independently provided, and the second electrode be provided to be continuous over the plurality of the first electrodes that are provided independently. Accordingly, a protective film for an insulating material that covers the piezoelectric layer is not needed, and electrical conduction of the independent first electrodes can be suppressed by the island-shaped lanthanum nickel oxide portions.

In addition, it is preferable that the lanthanum nickel oxide portions be formed by a sputtering method. Accordingly, the island-shaped lanthanum nickel oxide portions can be easily formed.

According to another aspect of the invention, there is provided a piezoelectric element including: a piezoelectric actuator including an insulating film, a first electrode provided on the insulating film, a piezoelectric layer that is provided on the first electrode and is made of a composite oxide having a perovskite structure containing lead, zirconium, and titanium, and a second electrode provided on the piezoelectric layer on the opposite side to the first electrode, wherein island-shaped lanthanum nickel oxide portions are formed in a region on the insulating film where at least the piezoelectric layer is formed, and at least on a side surface of the first electrode.

In this aspect, the piezoelectric element which has the piezoelectric layer with excellent crystalline properties and suppresses breakage of the piezoelectric layer can be realized.

Here, it is preferable that the lanthanum nickel oxide portions be also formed on a surface of the first electrode on the second electrode side. Accordingly, by controlling the orientation of the piezoelectric layer formed on the first electrode, the excellent piezoelectric layer can be realized.

According to still another aspect of the invention, there is provided a liquid ejecting head including the piezoelectric element as a pressure generation unit which causes a change in pressure in a pressure generation chamber communicating with a nozzle opening that ejects a liquid.

In this aspect, the liquid ejecting head can be realized which has excellent liquid ejecting characteristics, suppresses breakage of the piezoelectric layer, and thus has enhanced reliability.

According to further another aspect of the invention, there is provided a liquid ejecting apparatus including the liquid ejecting head.

In this aspect, the liquid ejecting apparatus can be realized which has excellent liquid ejecting characteristics, suppresses breakage of the piezoelectric layer, and thus has enhanced reliability.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Exemplary embodiments of the invention will now be described in detail.

First Embodiment

Figure 1:
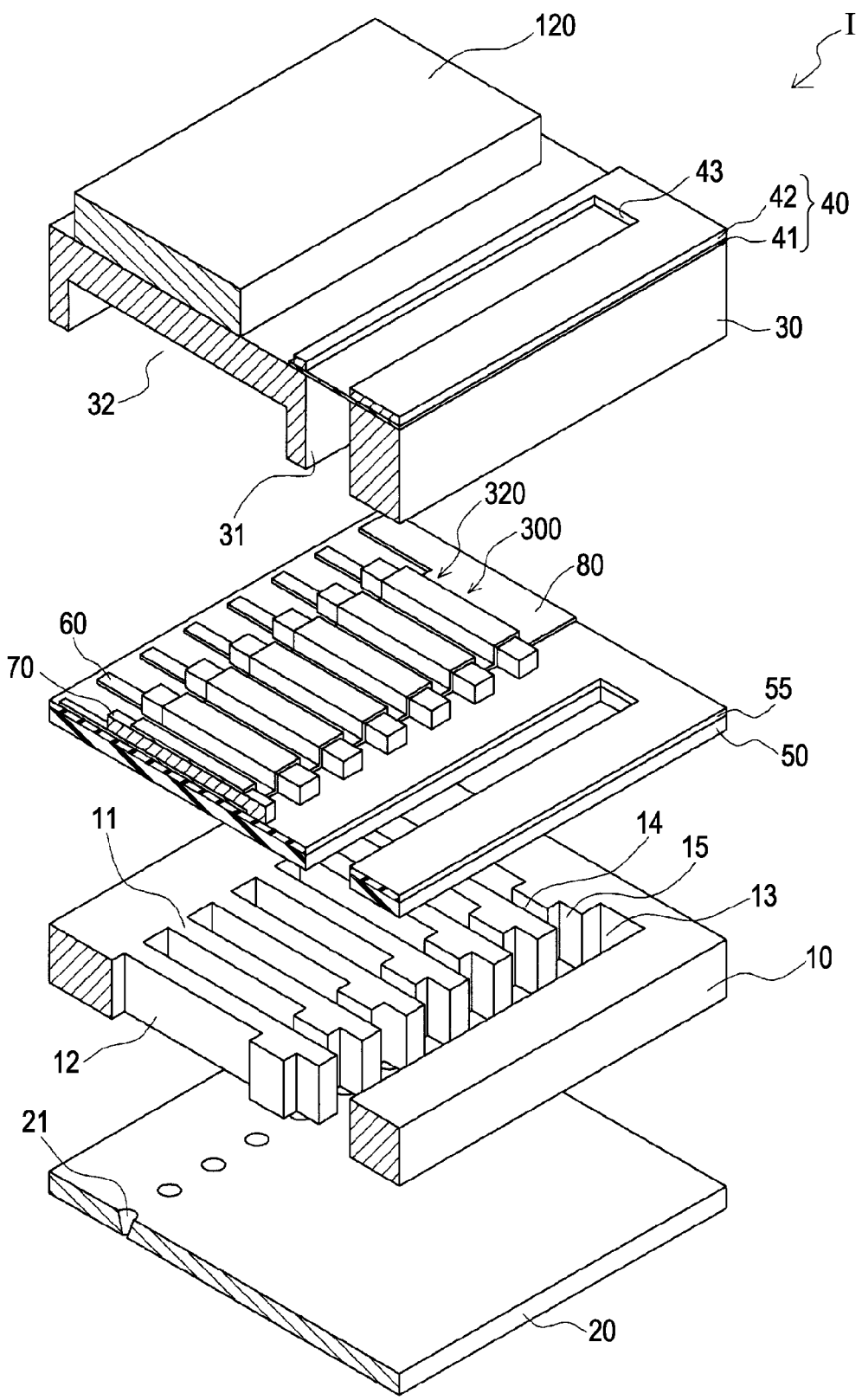
FIG. 1 is an exploded perspective view of a recording head according to a first embodiment of the invention.
Figure 2:
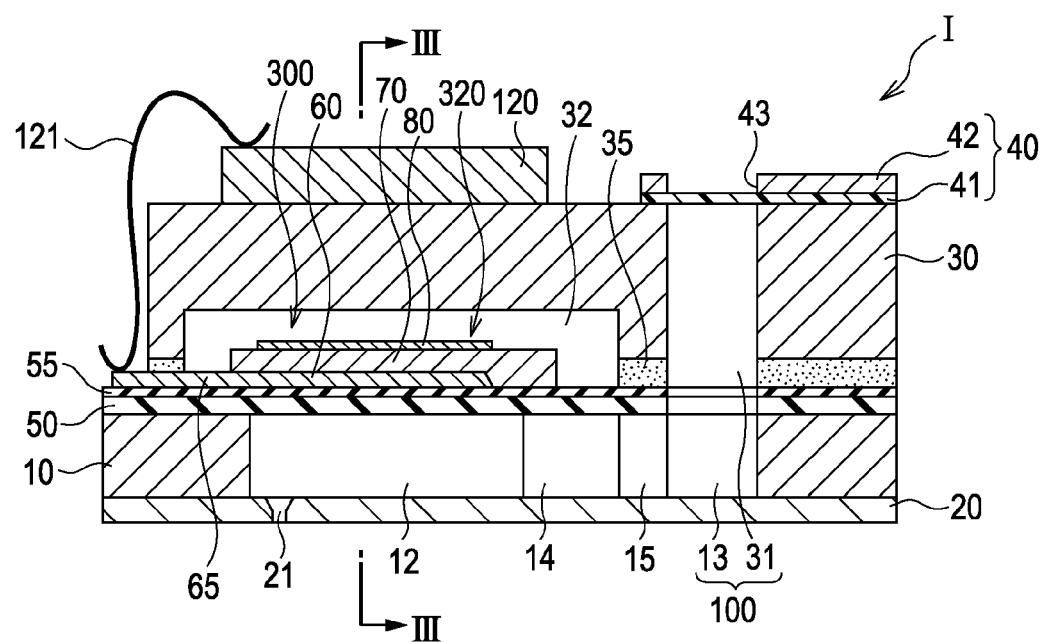
FIG. 2 is a cross-sectional view of the recording head according to the first embodiment of the invention.
Figure 3A:
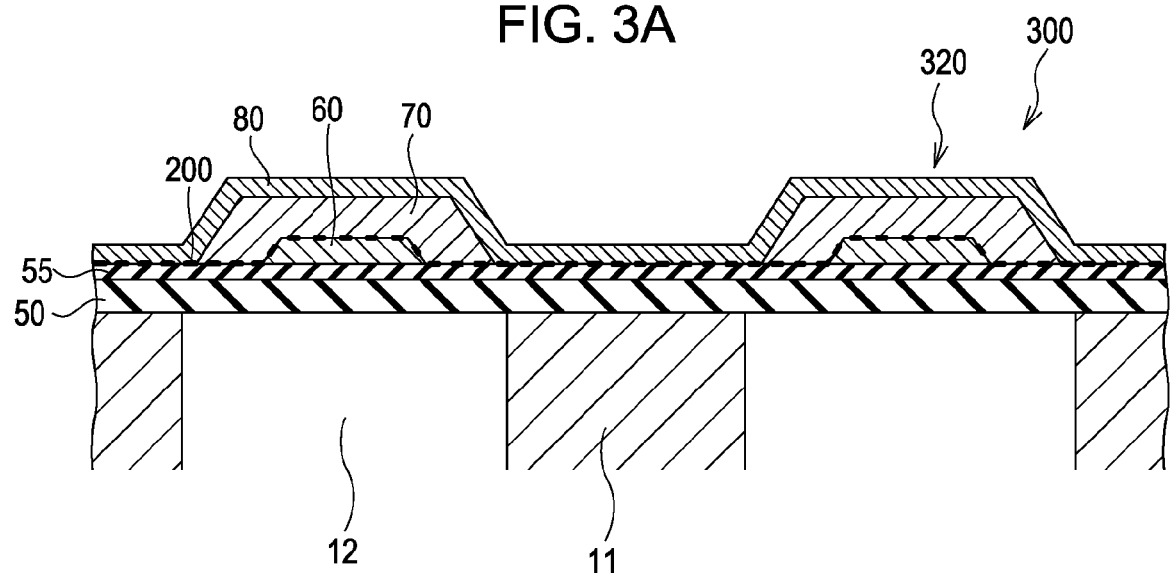
FIGS. 3A and 3B are enlarged cross-sectional views of a main part of the recording head according to the first embodiment of the invention.
Figure 3B:
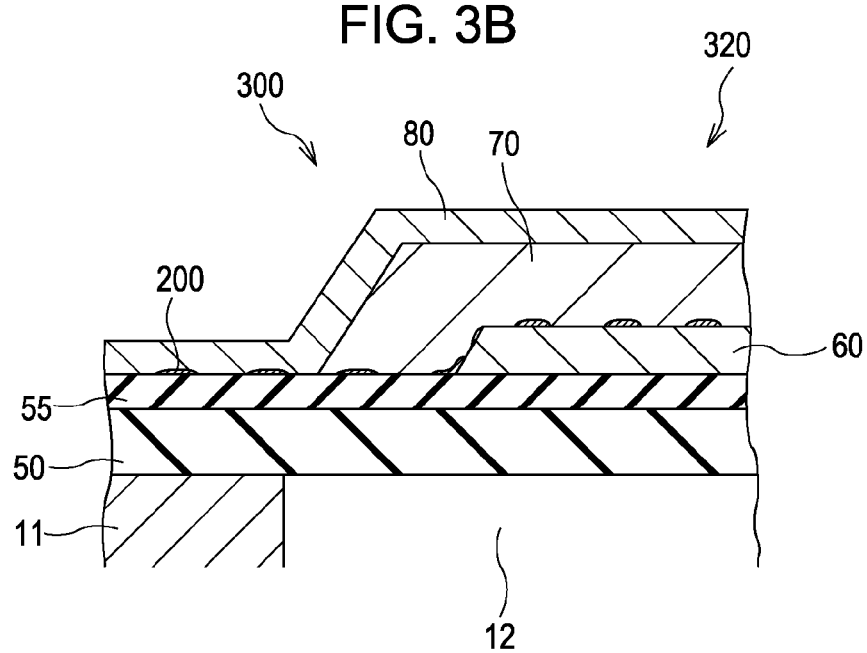

FIG. 1 is an exploded perspective view of an ink jet type recording head which is an example of a liquid ejecting head according to a first embodiment of the invention. FIG. 2 is a cross-sectional view of a pressure generation chamber of the ink jet type recording head in a second direction. FIGS. 3A and 3B are a cross-sectional view taken along the line III-III in FIG. 2 and an enlarged cross-sectional view of the main part thereof, respectively.

As illustrated, a flow path formation substrate 10 according to this embodiment is made of a single crystal silicon substrate, and on one face thereof, an elastic film 50 made of silicon dioxide is formed.

In the flow path formation substrate 10, a plurality of pressure generation chambers 12 are arranged along a direction in which a plurality of nozzle openings 21 that are to discharge ink with the same color are arranged. Thereafter, this direction is referred to as an arrangement direction of the pressure generation chambers 12, or a first direction. In an outer region of the flow path formation substrate 10 in a second direction which is orthogonal to the first direction of the pressure generation chambers 12, a communication portion 13 is formed, and the communication portion 13 and each of the pressure generation chambers 12 communicates with each other via an ink supply path 14 and a communication path 15 provided in each of the pressure generation chambers 12. The communication portion 13 communicates with a manifold portion 31 of a protective substrate described later and configures a part of a manifold which is a common ink chamber of the pressure generation chambers 12. The ink supply path 14 is formed to have a smaller width (the first direction) than the pressure generation chamber 12 so as to maintain the flow path resistance of ink flowing into the pressure generation chamber 12 from the communication portion 13 at a constant level. In addition, in this embodiment, the ink supply path 14 is formed by narrowing the width of the flow path from one side. However, the ink supply path may also be formed by narrowing the width of the flow path from both sides. In addition, the ink supply path may also be formed by narrowing the flow path in the thickness direction instead of by narrowing the width of the flow path.

In this embodiment, the flow path formation substrate 10 is provided with liquid flow paths configured of the pressure generation chambers 12, the communication portions 13, the ink supply paths 14, and the communication paths 15.

On an opening face side of the flow path formation substrate 10, a nozzle plate 20 in which nozzle openings 21 communicating with the vicinities of end portions of the pressure generation chambers 12 on the opposite side to the ink supply path 14 are bored is fixed by an adhesive, a thermal bonding film, or the like. In addition, the nozzle plate 20 is made of, for example, glass, ceramics, a single crystal silicon substrate, or stainless steel.

On the other hand, on the opposite side of the flow path formation substrate 10 to the opening face, the elastic film 50 is formed as described above, and an insulating film 55 is formed on the elastic film 50. As the insulating film 55, for example, zirconium oxide or yttria-stabilized zirconia (YSZ) made by adding yttrium oxide to zirconium oxide may be used.

On the insulating film 55, a first electrode 60, a piezoelectric layer 70, and a second electrode 80 are laminated. Here, in this embodiment, a part including the insulating film 55, the first electrode 60, the piezoelectric layer 70, and the second electrode 80 is referred to as a piezoelectric element 300. In general, the piezoelectric element 300 is configured by using any one of the electrodes of the piezoelectric element 300 as a common electrode and patterning the other electrode and the piezoelectric layer 70 for each of the pressure generation chambers 12. In addition, in a region of the piezoelectric layer 70 pinched between the two electrodes, a part having a piezoelectric strain due to an application of a voltage to both the electrodes is referred to as a piezoelectric active portion 320. In this embodiment, the first electrode 60 is provided for each of the pressure generation chambers 12 to serve as an individual electrode of the piezoelectric element 300, and the second electrode 80 is provided over the plurality of pressure generation chambers 12 to serve as the common electrode. That is, a plurality of the first electrodes 60 are provided separately and independently as the individual electrodes, and the second electrode 80 is provided electrically continuously over a region opposing the plurality of the first electrodes 60 to serve as the common electrode. In the example described above, the elastic film 50, the insulating film 55, and the first electrode 60 act as vibration plates. However, of course, this embodiment is not limited to this example, and for example, without providing the elastic film 50 and the insulating film 55, only the first electrode 60 may act as a vibration plate.

Here, the configuration of the piezoelectric element 300 will be described in detail with reference to FIGS. 2 to 3B.

As illustrated, the first electrodes 60 included in the piezoelectric element 300 are independently provided to correspond to the respective pressure generation chambers 12. Here, the fact that the first electrodes 60 are independently provided to correspond to the respective pressure generation chambers 12 means that the first electrodes 60 are separated to be discontinuous in the arrangement direction of the pressure generation chambers 12. In this embodiment, the first electrode 60 is provided to have a width smaller than that of the pressure generation chamber 12 in the first direction (the width in the arrangement direction of the pressure generation chambers 12), such that the first electrodes 60 are provided independently to correspond to the respective pressure generation chambers 12.

In addition, the first electrodes 60 provided independently for the respective pressure generation chambers 12 are not electrically connected and thus function as the individual electrodes of the piezoelectric elements 300.

In the second direction of the pressure generation chambers 12, an end portion of the first electrode 60 on the opposite side to the ink supply path 14 is provided with an extension portion 65 extending to the outside from an end portion of the piezoelectric layer 70. The end portion of the extension portion 65 is not covered with the piezoelectric layer 70 but is exposed, and specifically, becomes a connection terminal electrically connected to a driving circuit 120 described later. That is, the first electrode 60 also functions as a drawn wire connected to the driving circuit 120 drawn from the piezoelectric element 300. Of course, a wire having conductivity which is different from the first electrode 60 may be drawn to be provided separately.

Regarding the first electrode 60, at least side surfaces on both sides thereof in the arrangement direction (the first direction) of the pressure generation chambers 12 are provided to be inclined. The inclination of the side surface of the first electrode 60 is determined so that the area of the first electrode 60 widens to the flow path formation substrate 10 side.

In this embodiment, the piezoelectric layers 70 are provided independently to correspond to the respective pressure generation chambers 12. That is, this means that the piezoelectric layers 70 provided for the respective pressure generation chambers 12 are separated to be discontinuous in the arrangement direction of the pressure generation chambers 12 for the respective pressure generation chambers 12.

In the first direction of the pressure generation chambers 12 (the arrangement direction of the pressure generation chambers 12), the piezoelectric layer 70 is provided to have a greater width than that of the first electrode 60 and have a smaller width than that of the pressure generation chamber 12 in the first direction, and the piezoelectric layer 70 covers the end surface of the first electrode 60 in the width direction.

In addition, the piezoelectric layer 70 is provided to be longer than the pressure generation chamber 12 in the second direction of the pressure generation chambers 12 (the direction intersecting the arrangement direction of the pressure generation chambers 12). In this embodiment, the piezoelectric layer 70 is provided to have a size so as to cover the end portion of the first electrode 60 on the ink supply path 14 side in the second direction of the pressure generation chambers 12.

Moreover, in the second direction of the pressure generation chambers 12, the piezoelectric layer 70 is provided to be shorter than the end portion of the first electrode 60 on the opposite side to the communication portion 13 so as to expose a part of the drawn wire of the first electrode 60. The driving circuit 120 is electrically connected to the exposed extension portion 65 of the first electrode 60.

In addition, the piezoelectric layer 70 is made of a piezoelectric material that presents an electromechanical conversion action, for example, a ferroelectric material having a perovskite structure and containing Zr or Ti as a metal such as lead zirconate titanate (PZT), a material made by adding metal oxides such as niobium oxide, nickel oxide, magnesium oxide, or lanthanum oxide to the ferroelectric material, and the like. Specifically, examples of the material include lead zirconate titanate ($Pb(Zr,Ti)O_3$), barium zirconate titanate ($Ba(Zr,Ti)O_3$), lead lanthanum zirconate titanate ($(Pb,La)(Zr,Ti)O_3$), and magnesium niobate zirconium titanate ($Pb(Zr,Ti)(Mg,Nb)O_3$). In addition, in the piezoelectric layer 70, crystals are primarily (100) face-oriented, and the crystal structure thereof is monoclinic. In this embodiment of the invention, the fact that "crystals are primarily (100) face-oriented" includes a case where all crystals are (100) face-oriented and a case where most crystals (for example, 90% or more) are (100) face-oriented. In addition, in this embodiment of the invention, the fact that "a crystal structure is monoclinic" includes a case where all crystals are monoclinic and a case where almost all crystals (for example, 90% or more) are monoclinic and the remaining crystals are tetragonal.

Moreover, it is preferable that the piezoelectric layer 70 has an engineered domain arrangement in which the polarization direction is inclined at a predetermined angle with respect to a direction perpendicular to the film surface (the thickness direction of the piezoelectric layer 70).

The thickness of the piezoelectric layer 70 is not particularly limited, and may be suppressed so as not to cause cracks during a production process and be increased so as to present sufficient displacement characteristics. For example, by forming the piezoelectric layer 70 into a thickness of about 0.2 to 5 µm, a desired crystal structure can be easily obtained. In this embodiment, in order to obtain optimal piezoelectric characteristics, the thickness of the piezoelectric layer 70 is 1.2 µm.

The production method of the piezoelectric layer 70 is not particularly limited, and the piezoelectric layer 70 may be formed using a so-called sol-gel method in which a so-called sol made by dissolving and dispersing an organic metal compound in a solvent is applied dried into a gel, and the gel is baked at a higher temperature, thereby obtaining the piezoelectric layer 70 made of a metal oxide. Of course, the production method of the piezoelectric layer 70 is not limited to the sol-gel method, and for example, so-called thin film forming methods including a MOD (Metal-Organic Decomposition) method and a PVD (Physical Vapor Deposition) method such as a sputtering method and a laser ablation method may be used.

In this embodiment, the piezoelectric layers 70 are provided independently for the respective pressure generation chambers 12. However, this embodiment is not particularly limited thereto, and for example, the piezoelectric layer 70 may be provided to be continuous over the plurality of pressure generation chambers 12. In this embodiment, the piezoelectric layers 70 are provided separately and independently for the respective pressure generation chambers 12, so that the piezoelectric layer 70 does not impede a displacement of the piezoelectric element 300. In addition, for example, in the case where the piezoelectric layers 70 are provided to be continuous in the arrangement direction of the pressure generation chambers 12, the piezoelectric layer 70 on a partition wall that forms the pressure generation chamber 12 may be provided with a through-hole so as to suppress the impediment of the displacement of the piezoelectric element 300.

The second electrode 80 is provided to be continuous in the arrangement direction of the plurality of pressure generation chambers 12. Here, the fact that the second electrode 80 is provided to be continuous on the plurality of pressure generation chambers 12 includes a case where the second electrode 80 is continuous between the adjacent pressure generation chambers 12 as illustrated in FIG. 3A. Of course, the second electrode 80 may also be discontinuous on the partition wall that forms the adjacent pressure generation chambers 12.

In addition, the second electrode 80 is provided in the region opposing the pressure generation chamber 12 in the second direction of the pressure generation chambers 12 (the direction intersecting the arrangement direction of the pressure generation chambers 12). That is, the end portion of the second electrode 80 in the second direction (the second direction of the pressure generation chambers 12) is provided to be positioned in the region of the pressure generation chamber 12.

In addition, the end portion of the second electrode 80 is provided inward from the end portion of the first electrode 60 in the second direction of the pressure generation chambers 12 (on the center side of the pressure generation chamber 12), that is, more on the pressure generation chamber 12 side than the first electrode 60, such that the second electrode 80 specifies both end portions of the piezoelectric active portion 320 of the piezoelectric layer 70 in the second direction.

In the piezoelectric element 300 having the first electrode 60, the piezoelectric layer 70, and the second electrode 80, the end portion in the first direction (width) of the piezoelectric active portion 320 which is an actual driving portion of the piezoelectric layer 70 is specified by the end portion of the first electrode 60 in the width direction (the first direction, that is, the arrangement direction of the pressure generation chambers 12), and the end portion in the second direction (length) of the piezoelectric active portion 320 is specified by the end portion of the second electrode 80 in the second direction (the second direction of the pressure generation chambers 12).

As illustrated in FIG. 3B, in the piezoelectric element 300 of this embodiment, island-shaped lanthanum nickel oxide (LNO) portions 200 are provided in a region where at least the piezoelectric layer 70 is formed on the insulating film 55 (on the opposite surface side to the flow path formation substrate 10) and at least on the side surface of the first electrode 60. In this embodiment, the island-shaped lanthanum nickel oxide portions 200 are provided on the entire surface on the insulating film 55 (the surface that is not covered with the first electrode 60) and on the side surface of the first electrode 60 and the surface thereof on the second electrode 80 side. Here, the fact that the lanthanum nickel oxide portions 200 are provided in island shapes means that the lanthanum nickel oxide portions 200 are not provided to be continuous over the insulating film 55 on the piezoelectric layer 70 side and on the first electrode 60 and a plurality of lanthanum nickel oxide portions 200 separated into island shapes are provided.

It is preferable that the lanthanum nickel oxide portions 200 be uniformly dotted on the base (the insulating film 55 and the first electrode 60). Here, the fact that the lanthanum nickel oxide portions 200 are uniformly dotted means that the number of lanthanum nickel oxide portions 200 per unit area of the base is substantially equal in any region. Accordingly, when the piezoelectric layer 70 is crystallized on the lanthanum nickel oxide portions 200, differences in crystal states due to the differences between the bases of the lanthanum nickel oxide portions 200 are suppressed, and thus the piezoelectric layer 70 can be formed in a uniform crystal state.

In addition, as described above, the island-shaped lanthanum nickel oxide portions 200 may be provided only in a region on the insulating film 55 where at least the piezoelectric layer 70 is formed. This is because the lanthanum nickel oxide portion 200 becomes a nucleus of a crystal during formation of the piezoelectric layer 70 and thus does not need to be provided in a region where the piezoelectric layer 70 is not formed. However, although described later in detail, since the piezoelectric layer 70 is formed on the insulating film 55 and the entire surface of the first electrode 60 and is then patterned, the lanthanum nickel oxide portions 200 may be formed in a region where the piezoelectric layer 70, that is, the entire surface of the insulating film 55 (a region that is not covered with the first electrode 60).

In addition, the lanthanum nickel oxide portions 200 are provided so as not to form small holes in the boundary part between the insulating film 55 and the first electrode 60. Therefore, the island-shaped lanthanum nickel oxide portions 200 may be formed on the insulating film 55 on which at least the piezoelectric layer 70 is formed as described and at least on the side surface of the first electrode 60. That is, the island-shaped lanthanum nickel oxide portions 200 may not be provided on the surface of the first electrode 60 on the second electrode 80 side (the surface parallel to the surface of the flow path formation substrate 10).

On the surface of the first electrode 60 on the second electrode 80 side, for example, instead of the lanthanum nickel oxide portions 200, crystal seeds that become nuclei when the piezoelectric layer 70 made of titanium, titanium oxide, or the like is formed may be provided. In this embodiment, the island-shaped lanthanum nickel oxide portions 200 are provided on the entire surface of the first electrode 60 on the piezoelectric layer 70 side, so that the lanthanum nickel oxide portions 200 function as nuclei when the piezoelectric layer 70 is formed.

It is thought that the lanthanum nickel oxide portions are layer-like compounds of lanthanum (La) having anisotropy in a two-dimensional direction and thus are primarily (001) face-oriented (natural orientation). Therefore, by forming the piezoelectric layer 70 on the lanthanum nickel oxide portions 200, crystal growth of the piezoelectric layer 70 is accelerated, such that the piezoelectric layer 70 can be primarily (100) face-oriented and can be formed to have minute grain sizes of about 50 to 200 nm. In addition, since there is a custom that the orientation direction of the lanthanum nickel oxide portions is on the c-axis (a direction perpendicular to the surface of a layer-like structure), the orientation direction is denoted by the (001) face. However, since the piezoelectric layer 70 has a pseudo-cubic structure, the orientation direction is denoted by the (100) face.

In this embodiment, since the lanthanum nickel oxide portions 200 are provided on the insulating film 55 and the first electrode 60, the piezoelectric layer 70 which is continuous from the insulating film 55 to the first electrode 60 is primarily (100) face-oriented and thus can be formed to have minute grain sizes. In addition, small holes are not formed in the boundary part between the insulating film 55 and the side surface of the first electrode 60, and when a voltage is applied to the piezoelectric element 300, an occurrence of cracks in the piezoelectric layer 70 from the small holes as the starting points can be suppressed. In addition, it can be said that these small holes are small voids actually formed in the piezoelectric layer 70 or parts where a low-dielectric material is formed, and although the presence of the small holes can be confirmed, whether the small holes are voids or the low-dielectric material is not specified. However, cracks occur in the piezoelectric layer 70 from the small holes mentioned here as the starting points.

In addition, since the lanthanum nickel oxide portions have electrically conductive properties, by forming the lanthanum nickel oxide portions 200 into island shapes, electrical conduction between the adjacent first electrodes 60 which are the individual electrodes of the piezoelectric elements 300 can be suppressed. In addition, when the lanthanum nickel oxide portions are formed into a continuous layer shape in the adjacent piezoelectric elements 300, the individual electrodes of the adjacent piezoelectric element 300 are electrically connected to each other, so that the piezoelectric elements 300 cannot be selectively driven.

On the flow path formation substrate 10 on which the piezoelectric element 300 is formed, that is, on the first electrode 60 and the insulating film 55, a protective substrate 30 having the manifold portion 31 that constitutes at least a part of the manifold 100 is bonded via an adhesive 35. In this embodiment, the manifold portion 31 penetrates through the protective substrate 30 in the thickness direction and is formed along the width direction of the pressure generation chamber 12, and communicates with the communication portion 13 of the flow path formation substrate 10 as described above so as to configure the manifold 100 which is the common ink chamber of the pressure generation chambers 12. In addition, the communication portion 13 of the flow path formation substrate 10 may be divided into a plurality of portions for each of the pressure generation chambers 12 such that only the manifold portion 31 constitutes the manifold. Moreover, for example, only the pressure generation chambers 12 may be provided in the flow path formation substrate 10, and the ink supply path 14 communicating with the manifold and each of the pressure generation chambers 12 may be provided in a member (for example, the elastic film 50 or the insulating film 55) interposed between the flow path formation substrate 10 and the protective substrate 30.

In addition, in a region of protective substrate 30 opposing the piezoelectric element 300, a piezoelectric element holding portion 32 having a space so as not to impede the movement of the piezoelectric element 300 is provided. The piezoelectric element holding portion 32 may have a space so as not to impede the movement of the piezoelectric element 300, and the space may be sealed or may not be sealed.

It is preferable that a material having substantially the same coefficient of thermal expansion as that of the flow path formation substrate 10, for example, a glass or ceramic material be used for the protective substrate 30. In this embodiment, the protective substrate 30 is formed using a single crystal silicon substrate made of the same material as that of the flow path formation substrate 10.

The driving circuit 120 for driving the piezoelectric elements 300 arranged in parallel is fixed onto the protective substrate 30. As the driving circuit 120, for example, a circuit board or a semiconductor integrated circuit (IC) may be used. In addition, the driving circuit 120, the first electrode 60, and the second electrode 80 are electrically connected to each other via a connection wire 121 made of a conductive wire such as a bonding wire.

A compliance substrate 40 configured of a sealing film 41 and a fixed plate 42 is bonded onto the protective substrate 30. Here, the sealing film 41 is made of a material having a low rigidity and flexibility, and one side of the manifold portion 31 is sealed by the sealing film 41. The fixed plate 42 is formed of a relatively hard material. A region of the fixed plate 42 opposing the manifold 100 is an opening portion 43 from which the fixed plate 42 is completely removed in the thickness direction, so that the one side of the manifold 100 is sealed only by the sealing film 41 having flexibility.

In the ink jet type recording head in this embodiment, ink is taken in from an ink introduction port connected to an external ink supply unit (not shown), the ink is filled therein so as to reach the nozzle opening 21 from the manifold 100, and thereafter a voltage is applied between the first and second electrodes 60 and 80 corresponding to the pressure generation chamber 12 according to a recording signal from the driving circuit 120 so as to cause the elastic film 50, the insulating film 55, the first electrode 60, and the piezoelectric layer 70 to be subjected to flexural deformation, such that the pressure in each of the pressure generation chambers 12 is increased, thereby discharging ink droplets from the nozzle openings 21.

A production method of the ink jet type recording head of this embodiment will be described with reference to FIGS. 4A to 8. FIGS. 4A to 8 are cross-sectional views of the pressure generation chamber in the second direction.

Figure 4A:
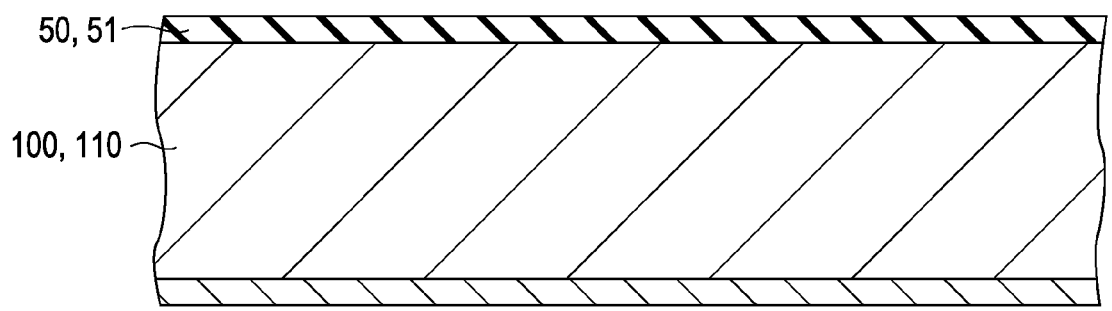
FIGS. 4A and 4B are cross-sectional views illustrating a production method of the recording head according to the first embodiment of the invention.

First, as illustrated in FIG. 4A, a silicon dioxide film 51 made of silicon dioxide ($SiO_2$) for constituting the elastic film 50 is formed on the surface of a wafer 110 for the flow path formation substrate which is a silicon wafer by thermal oxidation or the like.

Figure 4B:
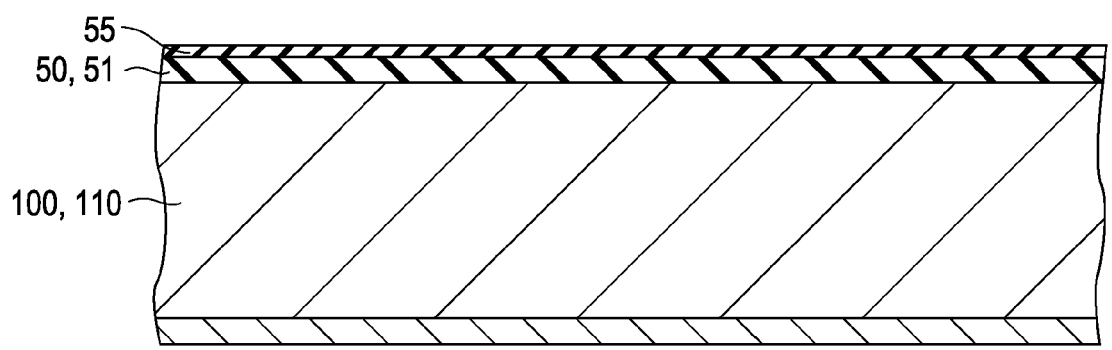

Subsequently, as illustrated in FIG. 4B, the insulating film 55 made of zirconium oxide is formed on the elastic film 50. The insulating film 55 may be formed by forming zirconium using a sputtering method and heating the resultant for thermal oxidation, or may be formed of zirconium oxide by a reactive sputtering method.

Figure 5A:
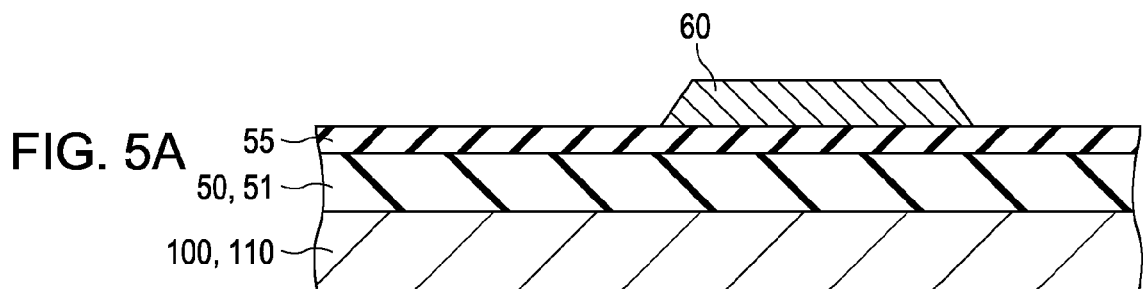
FIGS. 5A to 5E are cross-sectional views illustrating the production method of the recording head according to the first embodiment of the invention.

Subsequently, as illustrated in FIG. 5A, the first electrode 60 is formed on the entire surface on the insulating film 55 and is patterned for each of the pressure generation chambers 12. It is preferable that the material of the first electrode 60 be, although not particularly limited, a material of which a rate of change in conductivity due to diffusion of lead oxide is small in a case where lead zirconate titanate (PZT) is used as the piezoelectric layer 70. Therefore, as the material of the first electrode 60, platinum, iridium, or the like is appropriately used. In addition, the first electrode 60 may be formed by, for example, a sputtering method or a PVD method (Physical Vapor Deposition).

Figure 5B:
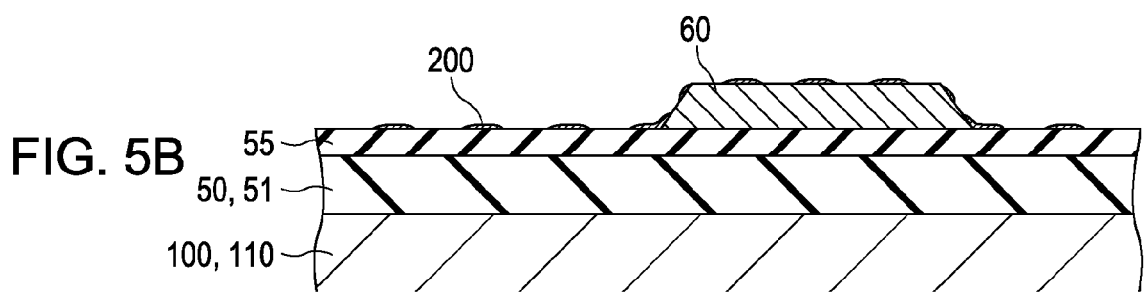

Next, as illustrated in FIG. 5B, the island-shaped lanthanum nickel oxide portions 200 are formed over the insulating film 55 and the first electrode 60. As described above, it is preferable that the lanthanum nickel oxide portions 200 be provided to be uniformly dotted around the base. A method of forming the lanthanum nickel oxide portions 200 is not particularly limited and may be, for example, a sputtering method.

Next, the piezoelectric layer 70 made of lead zirconate titanate (PZT) is formed. Here, in this embodiment, the piezoelectric layer 70 is formed using a so-called sol-gel method in which a so-called sol made by dissolving and dispersing a metal complex in a solvent is applied dried into a gel, and the gel is baked at a higher temperature, thereby obtaining the piezoelectric layer 70 made of a metal oxide. In addition, the production method of the piezoelectric layer 70 is not limited to the sol-gel methods, and for example, so-called thin film forming methods including a MOD (Metal-Organic Decomposition) method and a PVD (Physical Vapor Deposition) method such as a sputtering method and a laser ablation method may be used.

Figure 5C:
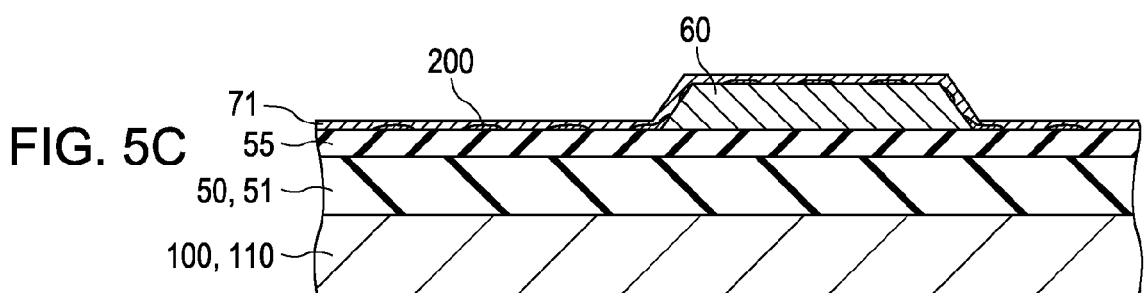

In a specific formation order of the piezoelectric layer 70, first, as illustrated in FIG. 5C, a piezoelectric precursor film 71 which is a PZT precursor film is formed on the insulating film 55 and the first electrode 60 (on the lanthanum nickel oxide portions 200). That is, the sol (solution) containing the metal complex is applied on the wafer 110 for the flow path formation substrate on which the insulating film 55 and the first electrode 60 are formed (application process). Subsequently, the piezoelectric precursor film 71 is heated at a predetermined temperature and is dried for a predetermined time (drying process). For example, in this embodiment, the piezoelectric precursor film 71 may be dried by being maintained at 170 to 180° C. for 8 to 30 minutes.

Next, the dried piezoelectric precursor film 71 is heated at a predetermined temperature and maintained for a predetermined time so as to be degreased (degreasing process). For example, in this embodiment, the piezoelectric precursor film 71 is heated at a temperature of about 300 to 400° C. and maintained for about 10 to 30 minutes so as to be degreased. In addition, "degreasing" mentioned here refers to separating an organic component contained in the piezoelectric precursor film 71 as, for example, $NO_2$, $CO_2$, and $H_2O$.

Figure 5D:
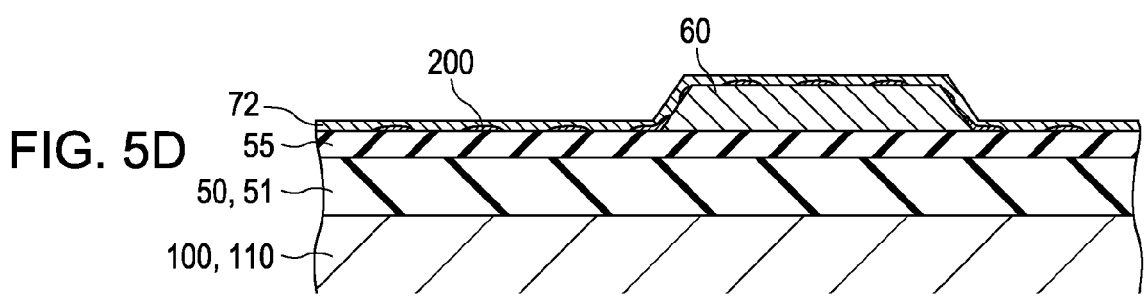

Next, as illustrated in FIG. 5D, the piezoelectric precursor film 71 is heated at a predetermined temperature and maintained for a predetermined time so as to be crystallized, thereby forming the piezoelectric film 72 (baking process). In this baking process, it is preferable that the piezoelectric precursor film 71 be heated at 700° C. or higher. In addition, in the baking process, it is preferable that a rate of temperature increase be equal to or higher than 50° C./sec. Consequently, the piezoelectric film 72 having excellent characteristics can be obtained.

As a heating apparatus used in the drying process, the degreasing process, and the baking process, for example, a hot plate, an RTP (Rapid Thermal Processing) apparatus which performs heating by illumination of an infrared lamp, and the like may be used.

Figure 5E:
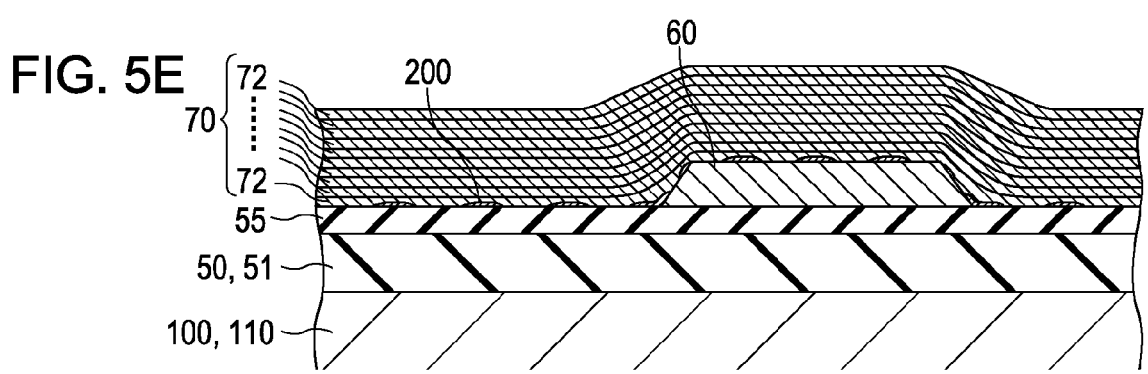

In addition, as illustrated in FIG. 5E, the piezoelectric film formation process including the application process, the drying process, the degreasing process, and the baking process described above is repeated a plurality of times, thereby forming the piezoelectric layer 70 made of the plurality of piezoelectric films 72.

In this manner, the piezoelectric layer 70 is formed to be continuous over the piezoelectric film 55 and the first electrode 60. In the region where the piezoelectric layer 70 is formed, the island-shaped lanthanum nickel oxide portions 200 are formed, so that the primary orientation of the piezoelectric layer 70 can be controlled to be (100) by the lanthanum nickel oxide portions 200 and the piezoelectric layer 70 can be formed to have minute grain sizes. In addition, by providing the lanthanum nickel oxide portions 200, formation of small holes in the boundary part between the insulating film 55 and the side surface of the first electrode 60 can be suppressed. In addition, the lanthanum nickel oxide portions 200 function as seeds for accelerating crystallization when the piezoelectric layer 70 is crystallized, and after baking the piezoelectric layer 70, a part thereof is diffused into the piezoelectric layer 70.

Figure 6A:
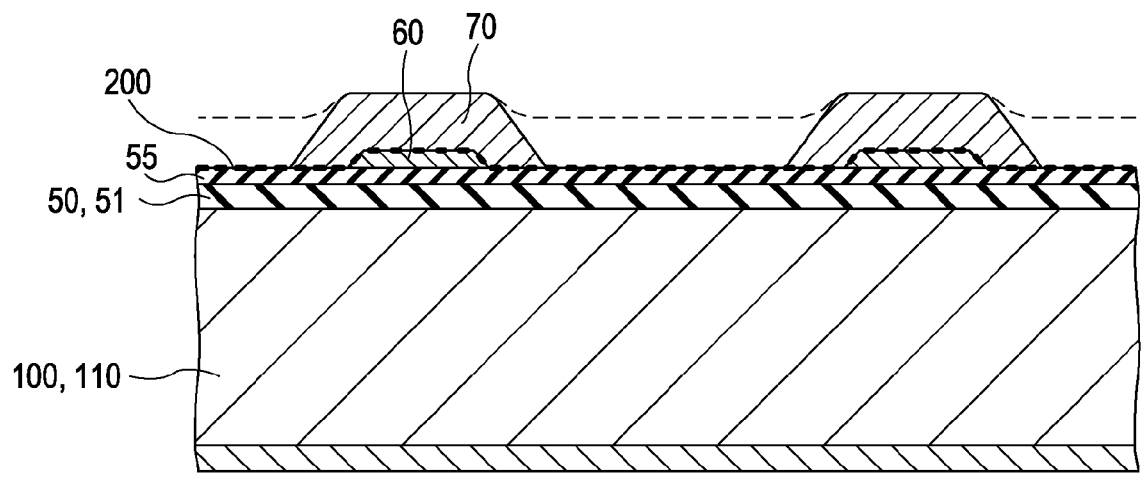
FIGS. 6A and 6B are cross-sectional views illustrating the production method of the recording head according to the first embodiment of the invention.

Next, as illustrated in FIG. 6A, the piezoelectric layer 70 is patterned into a region opposing each of the pressure generation chambers 12. In this embodiment, a mask formed into a predetermined shape is provided on the piezoelectric layer 70, and the piezoelectric layer 70 is etched via the mask, that is, is patterned by so-called photolithography. In addition, as the patterning method of the piezoelectric layer 70, dry etching such as reactive-ion etching or ion milling may be employed.

Figure 6B:
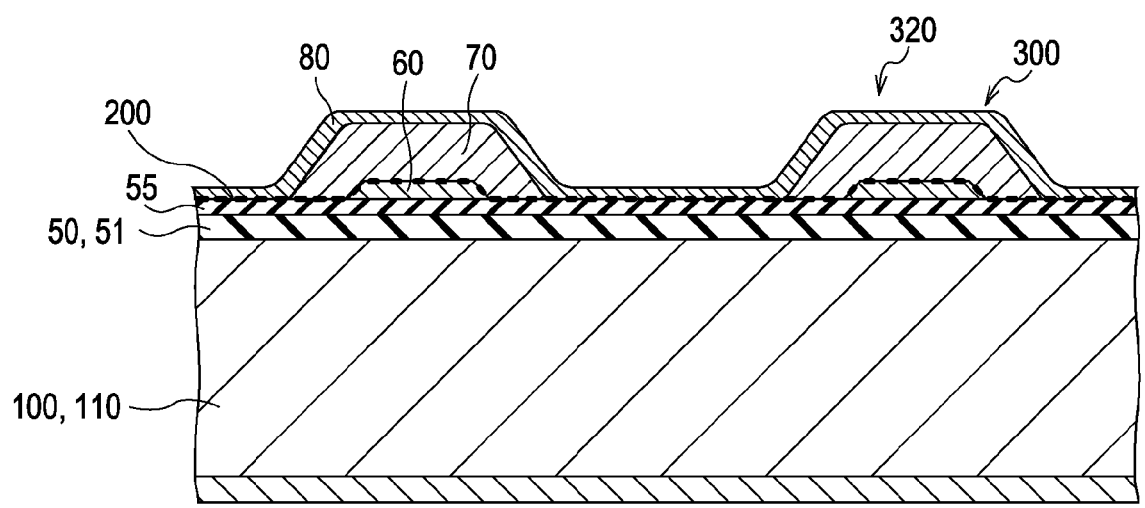

Next, as illustrated in FIG. 6B, the second electrode 80 made of, for example, iridium (Ir) is formed over the piezoelectric layer 70 and the insulating film 55, and is patterned into a predetermined shape, thereby forming the piezoelectric element 300.

Figure 7A:
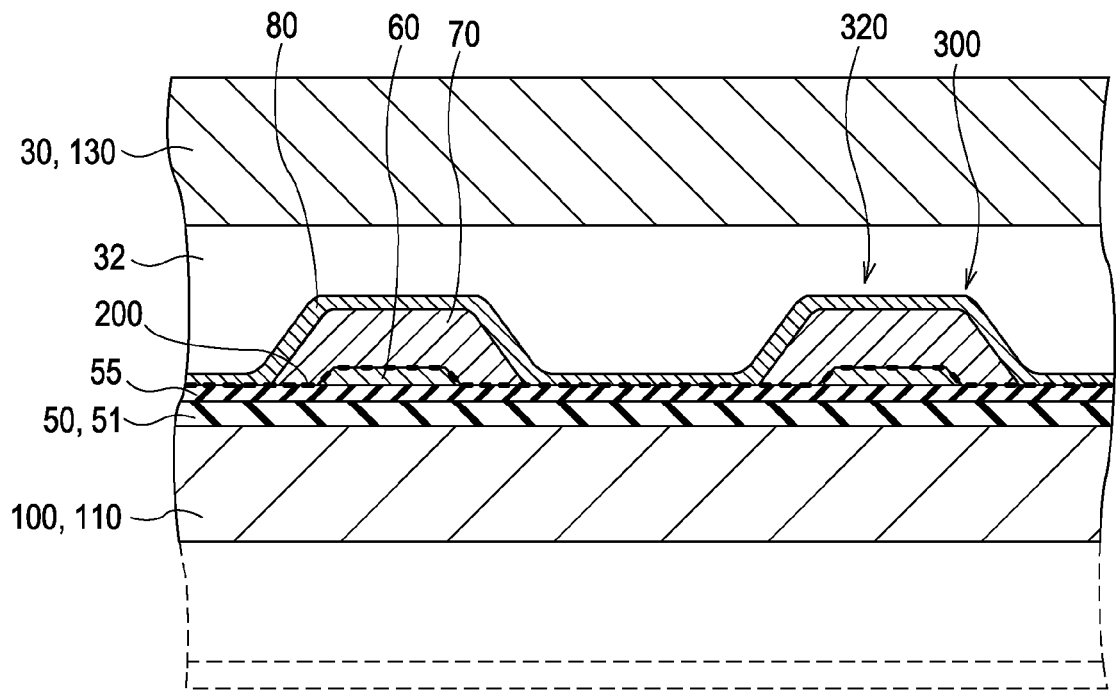
FIGS. 7A and 7B are cross-sectional views illustrating the production method of the recording head according to the first embodiment of the invention.

Next, as illustrated in FIG. 7A, on the piezoelectric element 300 side of the wafer 110 for the flow path formation substrate, a wafer 130 for the protective substrate which is a silicon wafer and is to be a plurality of the protective substrates 30 is bonded via the adhesive 35, and thereafter, the wafer 110 for the flow path formation substrate is thinned into a predetermined thickness.

Figure 7B:
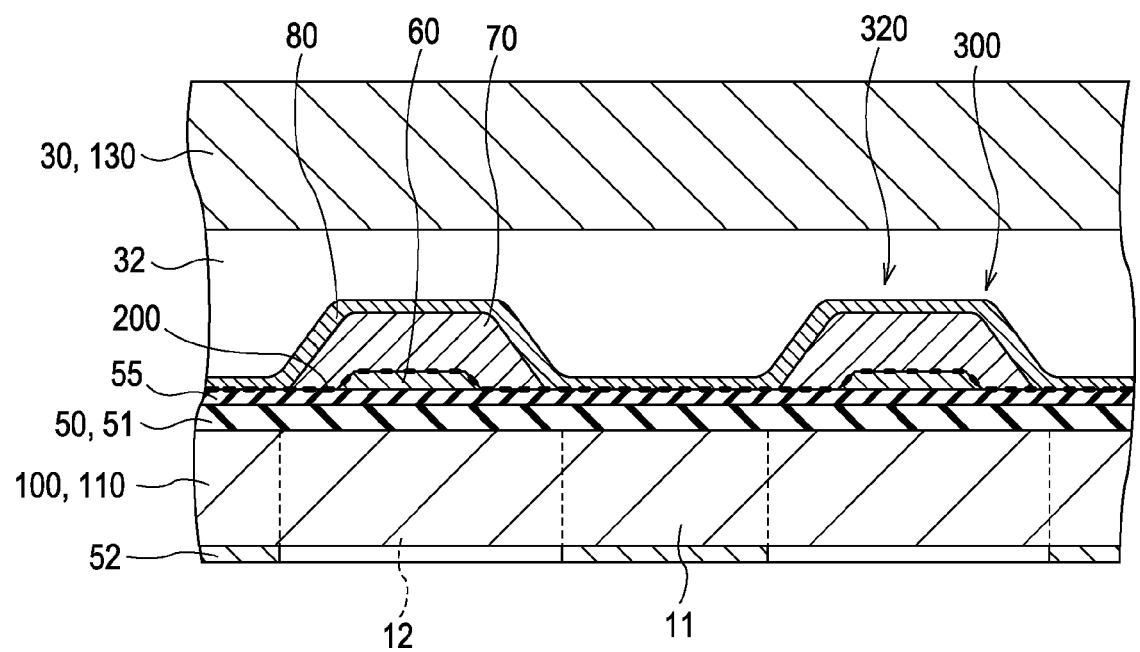
Figure 8:
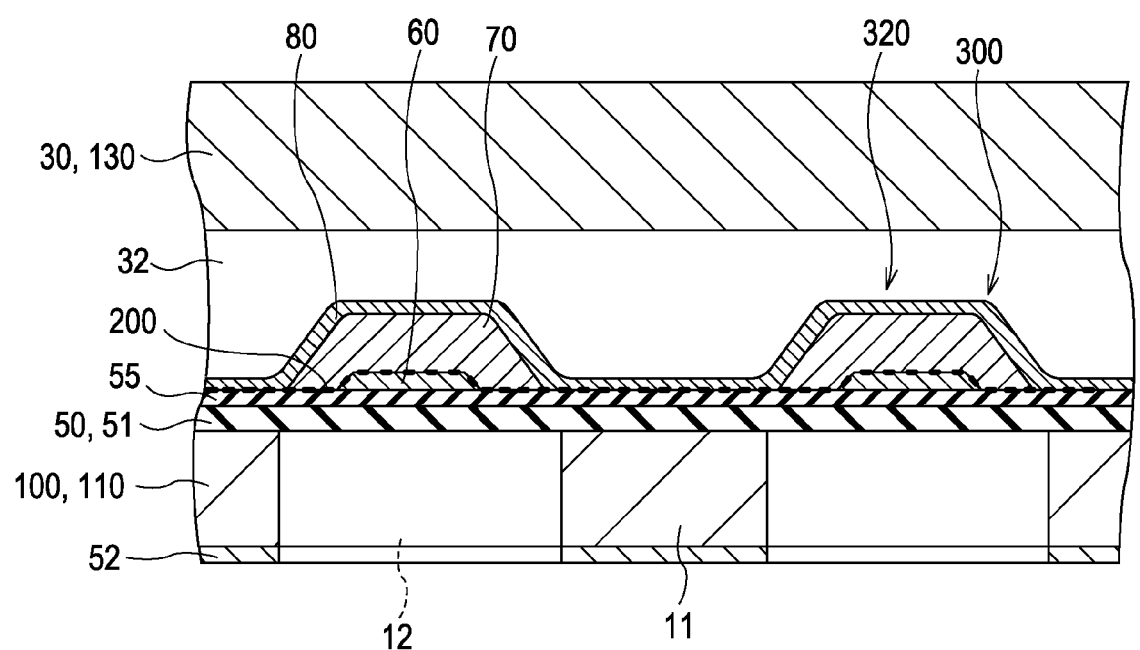
FIG. 8 is a cross-sectional view illustrating the production method of the recording head according to the first embodiment of the invention.

Subsequently, as illustrated in FIG. 7B, a mask film 52 is newly formed on the wafer 110 for the flow path formation substrate and is patterned into a predetermined shape. In addition, as illustrated in FIG. 8, by performing anisotropic etching (wet etching) using an alkali solution such as KOH on the wafer 110 for the flow path formation substrate via the mask film 52, the pressure generation chamber 12 corresponding to the piezoelectric element 300, the communication portion 13, the ink supply path 14, the communication path 15, and the like are formed.

Thereafter, unnecessary parts of the outer peripheral edge portions of the wafer 110 for the flow path formation substrate and the wafer 130 for the protective substrate are removed by cutting such as dicing. In addition, the nozzle plate 20 in which the nozzle openings 21 are bored is bonded to the opposite surface side of the wafer 110 for the flow path formation substrate to the wafer 130 for the protective substrate, the compliance substrate 40 is bonded to the wafer 130 for the protective substrate, and the wafer 110 for the flow path formation substrate and the like are divided into the flow path formation substrates 10 having a single chip size as illustrated in FIG. 1 and the like, thereby constituting the ink jet type recording head according to this embodiment.

EXAMPLES

Piezoelectric elements of Examples were made by changing the thickness of the lanthanum nickel oxide portions according to the production method as in the embodiment described above.

Comparative Example

For comparison, a first electrode was formed over the entire surface of an insulating film, titanium with a thickness of 5 nm was formed on the first electrode, and then a first piezoelectric film was formed thereon. After patterning the first piezoelectric film and the first electrode together, titanium with a thickness of 4 nm was formed over the insulating film, the side surface of the first electrode, and the first piezoelectric film, and then the second or further piezoelectric films were formed, thereby forming a piezoelectric layer. The resultant was used as a piezoelectric element of Comparative Example.

Test Example

For the piezoelectric elements of the Examples and the Comparative Example, whether or not crystals of the piezoelectric layers 70 on the insulating films had large grain size was measured. In addition, an occurrence of small holes in the boundary part between the insulating film and the first electrode 60 was measured. Moreover, an incidence of cracks in the piezoelectric elements was measured by applying a voltage to the piezoelectric elements. The results are shown in the following Table. Measurement of an increase in grain size of the crystals and an occurrence of small holes was made using SEM images. Regarding the incidence of cracks of the piezoelectric element, for ten flow path formation substrates, the number of piezoelectric elements in which cracks had occurred when a voltage of 60 V was applied to 180 piezoelectric elements provided on each of the flow path formation substrates for 25 minutes was measured.

TABLE

| | Material | Thickness (nm) | Large grains on insulating film | Occurrence of small holes | Influence on neighboring piezoelectric element | Incidence of cracks (%) |
|---|---|---|---|---|---|---|
| Comparative Example | Ti | 4 | Absence: ○ | Presence: X | Absence: ○ | 3.8 |
| Examples | LNO | 2 | Presence: X | Presence: X | Absence: ○ | 11.5 |
| | LNO | 4 | Absence: ○ | Absence: ○ | Absence: ○ | 1.8 |
| | LNO | 12 | Absence: ○ | Absence: ○ | Absence: ○ | 1.7 |
| | LNO | 20 | Absence: ○ | Absence: ○ | Absence: ○ | 1.9 |
| | LNO | 30 | Absence: ○ | Absence: ○ | Presence: X | Measurement impossible |

As shown in Table, from among the piezoelectric elements of the Examples, in the piezoelectric elements in which the lanthanum nickel oxide portions were provided to have thicknesses of 4 nm to 20 nm, the crystals of the piezoelectric layers on the insulating films did not have large grain sizes, small holes did not occur, and compared to the piezoelectric element provided with titanium in the Comparative Example, the occurrence of cracks in the piezoelectric layers could be suppressed to be low.

In contrast to this, it can be seen that, from the piezoelectric elements of the Examples, the incidence of cracks in the piezoelectric elements in which the lanthanum nickel oxide portions having a thickness of 2 nm were provided was high. It is thought that this is because, when the lanthanum nickel oxide portion is too thin, crystals of the piezoelectric layer on the insulating film have large grain sizes, and small holes occur, so that the lanthanum nickel oxide portions cannot exhibit a function of controlling the orientation of the piezoelectric layer formed thereon.

From among the piezoelectric elements of the Examples, in the piezoelectric elements in which the lanthanum nickel oxide portions having a thickness of 30 nm were provided, the first electrode was electrically connected to the adjacent piezoelectric element, so that the incidence of cracks could not be measured. This is because, when the lanthanum nickel oxide portions are too thick, the lanthanum nickel oxide portions are provided in a continuous layer shape other than dotted island shapes, and the adjacent first electrodes are electrically connected to each other and thus cannot function as the individual electrodes. In addition, it is thought that when the lanthanum nickel oxide portions are not provided in the layer shape but provided in island shapes, even with a thickness of 30 nm, the incidence of cracks in the piezoelectric elements can be measured.

Other Embodiments

While the embodiments of the invention have been described, the basic configuration of the invention is not limited to the above description. For example, in the first embodiment described above, the first electrodes are the individual electrodes of the plurality of piezoelectric elements and the second electrode is the common electrode which is common to the plurality of piezoelectric elements. However, the invention is not particularly limited thereto, and the first electrode may function as the common electrode and the second electrode may function as the individual electrode. In this case, it may be considered that the lanthanum nickel oxide portions are provided in the layer shape other than the island shapes. However, since the lanthanum nickel oxide portions have electrical conductive properties, if the lanthanum nickel oxide portions are provided in the layer shape, the end portion of the piezoelectric active portion cannot be specified by the first electrode, and the piezoelectric active portion is formed to the outside of the pressure generation chamber 12. In this embodiment, by providing the lanthanum nickel oxide portions in the island shapes, the end portion of the piezoelectric active portion can be specified by the first electrode, and the piezoelectric active portion is provided in the region opposing the pressure generation chamber 12, thereby ensuring displacement characteristics. In addition, if the lanthanum nickel oxide portions are provided in the layer shape, there is a concern that the rigidity of the vibration plate is increased and thus degradation of the displacement of the piezoelectric element is caused. However, by providing the lanthanum nickel oxide portions in the island shapes, an increase in the rigidity of the vibration plate is suppressed, and degradation of the displacement of the piezoelectric element can be suppressed.

In addition, in the example described above, even though a protective film having humidity resistance is not provided on the piezoelectric element 300, since a predetermined end portion of the first electrode 60 is covered with the piezoelectric layer 70, there is no current leakage between the first and second electrodes 60 and 80, and breakage of the piezoelectric element 300 can be suppressed. In addition, since the end portion of the first electrode 60 is drawn to the outside of the piezoelectric layer 70, a part that is not covered with the piezoelectric layer 70 is present. However, since there is a distance between the first and second electrodes 60 and 80, there is no particular influence. Of course, the piezoelectric element 300 can be further reliably protected by providing the protective film having humidity resistance for the piezoelectric element 300 of the example described above. However, as the protective film is not provided as in the piezoelectric element 300 of the example described above, there is no impediment to the displacement of the piezoelectric element 300 due to the protective film, and a high displacement amount can be obtained.

Moreover, the first electrode 60 may be formed of the lanthanum nickel oxide portions, or a laminate structure in which the lanthanum nickel oxide portions are provided in the uppermost layer of the first electrode 60 on the piezoelectric layer 70 side may be employed. In the case where at least the uppermost layer of the first electrode 60 is the lanthanum nickel oxide portions, on a region included in the first electrode 60 except for the lanthanum nickel oxide portions, that is, on the insulating film 55 or the side surface of the first electrode other than the uppermost layer, the lanthanum nickel oxide portions 200 may be provided in the island shapes.

Moreover, in the example described above, the piezoelectric layers 70 are separated for the respective pressure generation chambers 12. However, the invention is not particularly limited to this, and for example, the piezoelectric layer 70 which is continuous along the arrangement direction of the pressure generation chambers 12 may be provided.

Figure 9:
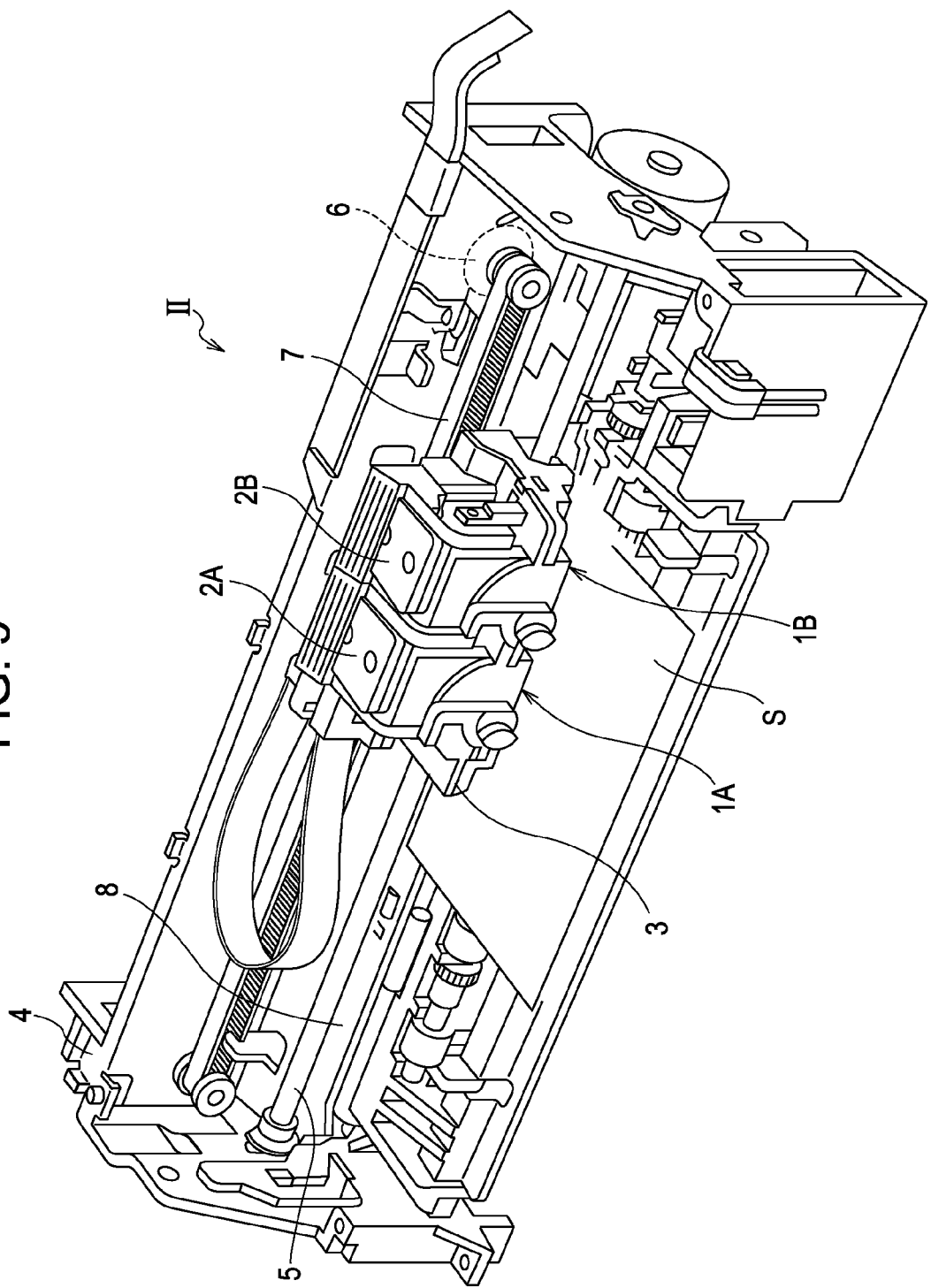
FIG. 9 is a diagram illustrating a schematic configuration of a recording apparatus according to an embodiment of the invention.

In addition, the ink jet type recording head of these embodiments constitutes a part of a recording head unit which includes an ink flow path communicating with an ink cartridge or the like and is mounted in the ink jet type recording apparatus. FIG. 9 is a schematic diagram showing an example of the ink jet type recording apparatus.

In the ink jet type recording apparatus II shown in FIG. 9, cartridges 2A and 2B which are used to constitute the ink supply unit are detachably provided in recording head units 1A and 1B having the ink jet type recording head I, and a carriage 3 in which the recording head units 1A and 1B are mounted is provided on a carriage shaft 5 mounted on an apparatus body 4 so as to move in the axial direction. The recording head units 1A and 1B respectively discharge, for example, a black ink composition and a color ink composition.

As a driving force of a driving motor 6 is transmitted to the carriage 3 via a plurality of gears (not shown) and a timing belt 7, the carriage 3 in which the recording head units 1A and 1B are mounted is moved along the carriage shaft 5. On the other hand, a platen 8 is provided in the apparatus body 4 along the carriage shaft 5, and a recording sheet S which is a recording medium such as paper fed by a feed roller (not shown) or the like is wound around the platen 8 so as to be transported.

In addition, in the ink jet type recording apparatus II described above, the case where the ink jet type recording head I (the head units 1A and 1B) are mounted in the carriage 3 and is moved in a main scanning direction is exemplified. However, the invention is not limited to this, and for example, the invention may be applied to a so-called line type recording apparatus in which the ink jet type recording head I is fixed and printing is performed only by moving a recording sheet S such as paper in a sub-scanning direction.

In the embodiment described above, the ink jet type recording head is described as an example of a liquid ejecting head. However, the invention is widely applied to general liquid ejecting heads, and may also be applied to a liquid ejecting head that ejects a liquid other than ink. As the other liquid ejecting heads, for example, there are various recording heads used in an image recording apparatus such as a printer, a color material ejecting head used for producing a color filter of a liquid crystal display or the like, an electrode material ejecting head used for forming an electrode of an organic EL display, an FED (field emission display), or the like, and a biological organic material ejecting head used for producing biochips.

In addition, the invention is not limited to the piezoelectric element used in the liquid ejecting head, and may also be applied to other devices. Examples of the other devices include an ultrasonic device such as an ultrasonic transducer, an ultrasonic motor, and a piezoelectric transducer. In addition, the invention may also be applied to a piezoelectric element used as a sensor. Examples of the sensor using the piezoelectric element include an infrared sensor, an ultrasonic sensor, a thermal sensor, a pressure sensor, and a pyroelectric sensor.

What is claimed is:

1. A piezoelectric element comprising:
    a piezoelectric actuator including an insulating film, a first electrode provided on the insulating film, a piezoelectric layer that is provided on the first electrode and is made of a composite oxide having a perovskite structure containing lead, zirconium, and titanium, and a second electrode provided on the piezoelectric layer on the opposite side to the first electrode,
    wherein island-shaped lanthanum nickel oxide portions are formed in a region on the insulating film where at least the piezoelectric layer is formed, and at least on a side surface of the first electrode.

2. The piezoelectric element according to claim 1, wherein the lanthanum nickel oxide portions are also formed on a surface of the first electrode on the second electrode side.

3. A liquid ejecting head including the piezoelectric element according to claim 1 as a pressure generation unit which causes a change in pressure in a pressure generation chamber communicating with a nozzle opening that ejects a liquid.

4. A liquid ejecting apparatus including the liquid ejecting head according to claim 3.

5. A production method of a piezoelectric element which includes an insulating film, a first electrode provided on the insulating film, a piezoelectric layer that is provided on the first electrode and is made of a composite oxide having a perovskite structure containing lead, zirconium, and titanium, and a second electrode provided on the piezoelectric layer on the opposite side to the first electrode, the production method comprising:
    forming and patterning the first electrode on the insulating film;
    forming island-shaped lanthanum nickel oxide portions over the insulating film and the first electrode; and forming a piezoelectric precursor film over the insulating film and the first electrode, and forming the piezoelectric layer having a piezoelectric film that is crystallized by baking the piezoelectric precursor film.

6. The production method according to claim 5, wherein, in the forming of the lanthanum nickel oxide portions, the lanthanum nickel oxide portions are formed to have a thickness of equal to or greater than 4 nm and equal to or smaller than 20 nm.

7. The production method according to claim 5, wherein a plurality of the first electrodes are independently provided, and the second electrode is provided to be continuous over the plurality of the first electrodes that are provided independently.

8. The production method according to claim 5, wherein the lanthanum nickel oxide portions are formed by a sputtering method.

* * * * *